(12) United States Patent
Nagai

(10) Patent No.: US 10,600,782 B2
(45) Date of Patent: Mar. 24, 2020

(54) SEMICONDUCTOR DEVICE

(71) Applicant: TOYOTA JIDOSHA KABUSHIKI KAISHA, Toyota-shi (JP)

(72) Inventor: Takaya Nagai, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/237,764

(22) Filed: Jan. 2, 2019

(65) Prior Publication Data

US 2019/0214383 A1 Jul. 11, 2019

(30) Foreign Application Priority Data

Jan. 11, 2018 (JP) ................................ 2018-002852

(51) Int. Cl.
| | |
|---|---|
| *H01L 27/07* | (2006.01) |
| *H01L 29/861* | (2006.01) |
| *H01L 29/40* | (2006.01) |
| *H01L 29/08* | (2006.01) |
| *H01L 29/10* | (2006.01) |
| *H01L 29/417* | (2006.01) |
| *H01L 29/423* | (2006.01) |
| *H01L 29/739* | (2006.01) |

(52) U.S. Cl.
CPC ...... *H01L 27/0716* (2013.01); *H01L 29/0804* (2013.01); *H01L 29/0821* (2013.01); *H01L 29/0834* (2013.01); *H01L 29/1095* (2013.01); *H01L 29/407* (2013.01); *H01L 29/41708* (2013.01); *H01L 29/4236* (2013.01); *H01L 29/7397* (2013.01); *H01L 29/861* (2013.01); *H01L 29/8613* (2013.01)

(58) Field of Classification Search
CPC ............. H01L 27/0716; H01L 29/0834; H01L 29/407; H01L 29/8613; H01L 29/861; H01L 29/7397; H01L 29/4236; H01L 29/41708; H01L 29/1095; H01L 29/0821; H01L 29/0804
USPC ........ 257/140, 139, 288, 330, 483, E29.037, 257/E29.201; 438/133, 138
See application file for complete search history.

(56) References Cited

U.S. PATENT DOCUMENTS

| | | | |
|---|---|---|---|
| 10,056,450 B2 * | 8/2018 | Kouno | .................. H01L 29/063 |
| 2002/0100934 A1 | 8/2002 | Nakagawa et al. | |
| 2009/0242931 A1 * | 10/2009 | Tsuzuki | ................ H01L 29/167 257/143 |

(Continued)

FOREIGN PATENT DOCUMENTS

JP 2002-305305 10/2002

*Primary Examiner* — Dao H Nguyen
(74) *Attorney, Agent, or Firm* — Oblon, McClelland, Maier & Neustadt, L.L.P.

(57) ABSTRACT

A semiconductor device may include a semiconductor substrate. A semiconductor substrate may include a diode region and an IGBT region provided adjacent to the diode region. The IGBT region may include a plurality of first conductive-type low concentration regions provided between a buffer region and a collector region, arranged with intervals therebetween in a direction parallel to the semiconductor substrate, and having a lower impurity concentration than the collector region. The collector region may include a first contact portion that is in contact with the buffer region between the low concentration regions adjacent to each other.

4 Claims, 7 Drawing Sheets

(56) References Cited

U.S. PATENT DOCUMENTS

| | | | |
|---|---|---|---|
| 2011/0254050 A1* | 10/2011 | Udrea | H01L 29/0834 257/140 |
| 2013/0075784 A1* | 3/2013 | Ikeda | H01L 27/0727 257/140 |
| 2013/0181254 A1* | 7/2013 | Iwasaki | H01L 29/7393 257/140 |
| 2014/0070270 A1* | 3/2014 | Yoshida | H01L 29/66128 257/140 |
| 2014/0377942 A1* | 12/2014 | Noguchi | H01L 21/266 438/529 |

* cited by examiner

SEMICONDUCTOR DEVICE

CROSS-REFERENCE

This application claims priority to Japanese Patent Application No. 2018-002852, filed on Jan. 11, 2018, the entire contents of which are incorporated herein by reference.

TECHNICAL FIELD

A technology disclosed herein relates to a semiconductor device.

BACKGROUND

Patent Literature 1 (Japanese Patent Application Publication No. 2002-305305) describes an insulating gate bipolar transistor (IGBT). The IGBT in Patent Literature 1 includes a semiconductor substrate, an upper surface electrode disposed on an upper surface of the semiconductor substrate, and a lower surface electrode disposed on a lower surface of the semiconductor substrate. The IGBT in Patent Literature 1 also includes an n-type emitter region provided in a portion disposed at the upper surface of the semiconductor substrate, a p-type collector region provided in a portion disposed at the lower surface of the semiconductor substrate, an n-type drift region provided between the emitter region and the collector region, a p-type body region provided between the emitter region and the drift region, and a gate trench extending from the upper surface of the semiconductor substrate to a depth reaching the drift region through the emitter region and the body region. A gate electrode is disposed in the gate trench. The IGBT in Patent Literature 1 also includes an n-type buffer region provided between the drift region and the collector region, and a p-type low concentration region provided between the buffer region and the collector region. The buffer region has an impurity concentration higher than an impurity concentration of the drift region. The low concentration region has an impurity concentration lower than an impurity concentration of the collector region.

In the technology in Patent Literature 1, carriers are accumulated in the low concentration region when the IGBT is in an on-state. This mitigates a sharp current decrease at turn-off of the IGBT. The carriers, which have been accumulated in the low concentration region move to the collector region, thereby leading to a gentle current decrease. Moreover, the mitigation of the sharp current decrease suppresses an oscillation (a noise) of a voltage between the upper and lower surface electrodes.

SUMMARY

In the technology in Patent Literature 1, a noise at turn-off of the IGBT is suppressed as described above. In the technology in Patent Literature 1, however, the carriers may be hindered from moving through the low concentration region at turn-on of the IGBT since the low concentration region has the lower impurity concentration and a higher resistance than the collector region. This may cause a snap-back phenomenon in which a voltage between the emitter region and the collector region temporarily rises at turn-on of the IGBT and then a current that flows in the IGBT increases. The disclosure herein thus provides a technology capable of suppressing the snap-back phenomenon at turn-on of the IGBT, while suppressing a noise at turn-off of the IGBT.

A semiconductor device disclosed herein may comprise a semiconductor substrate, an upper surface electrode disposed on an upper surface of the semiconductor substrate, and a lower surface electrode disposed on a lower surface of the semiconductor substrate. The semiconductor substrate may comprise a diode region and an IGBT region provided adjacent to the diode region. The diode region may comprise a first conductive-type anode region provided in a portion disposed at the upper surface of the semiconductor substrate, a second conductive-type cathode region provided in a portion disposed at the lower surface of the semiconductor substrate, and a second conductive-type diode drift region provided between the anode region and the cathode region. The IGBT region may comprise a second conductive-type emitter region provided in a portion disposed at the upper surface of the semiconductor substrate, a first conductive-type collector region provided in a portion disposed at the lower surface of the semiconductor substrate, a second conductive-type IGBT drift region provided between the emitter region and the collector region, and provided adjacent to the diode drift region, a first conductive-type body region provided between the emitter region and the IGBT drift region, a gate trench extending from the upper surface of the semiconductor substrate to a depth reaching the IGBT drift region through the emitter region and the body region, a second conductive-type buffer region provided between the IGBT drift region and the collector region and having a higher impurity concentration than the IGBT drift region, and a plurality of first conductive-type low concentration regions provided between the buffer region and the collector region, arranged with intervals therebetween in a direction parallel to the semiconductor substrate, and having a lower impurity concentration than the collector region. A gate electrode may be disposed in the gate trench. The collector region may comprise a first contact portion that is in contact with the buffer region between the low concentration regions adjacent to each other.

According to this configuration, when an IGBT is in an on-state (when a current flows in the IGBT region), carriers are accumulated in the low concentration regions. This mitigates a sharp current decrease at turn-off of the IGBT. The carriers, which have been accumulated in the low concentration regions move to the collector region, thereby leading to a gentle current decrease. Moreover, the mitigation of the sharp current decrease suppresses an oscillation (a noise) of a voltage between the upper and lower surface electrodes. Moreover, according to the configuration above, the collector region comprises the first contact portion that is in contact with the buffer region, and thus the carriers move through the first contact portion at turn-on of the IGBT. Therefore, when the IGBT is turned on, the carriers are not hindered from moving between the collector region and the buffer region. This can suppress a phenomenon in which a voltage between the emitter region and the collector region temporarily rises at turn-on of the IGBT and then a current that flows in the IGBT increases. In other words, the snap-back phenomenon can be suppressed. As described above, the configuration above can suppress the snap-back phenomenon at turn-on of the IGBT, while suppressing the noise at turn-off of the IGBT.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
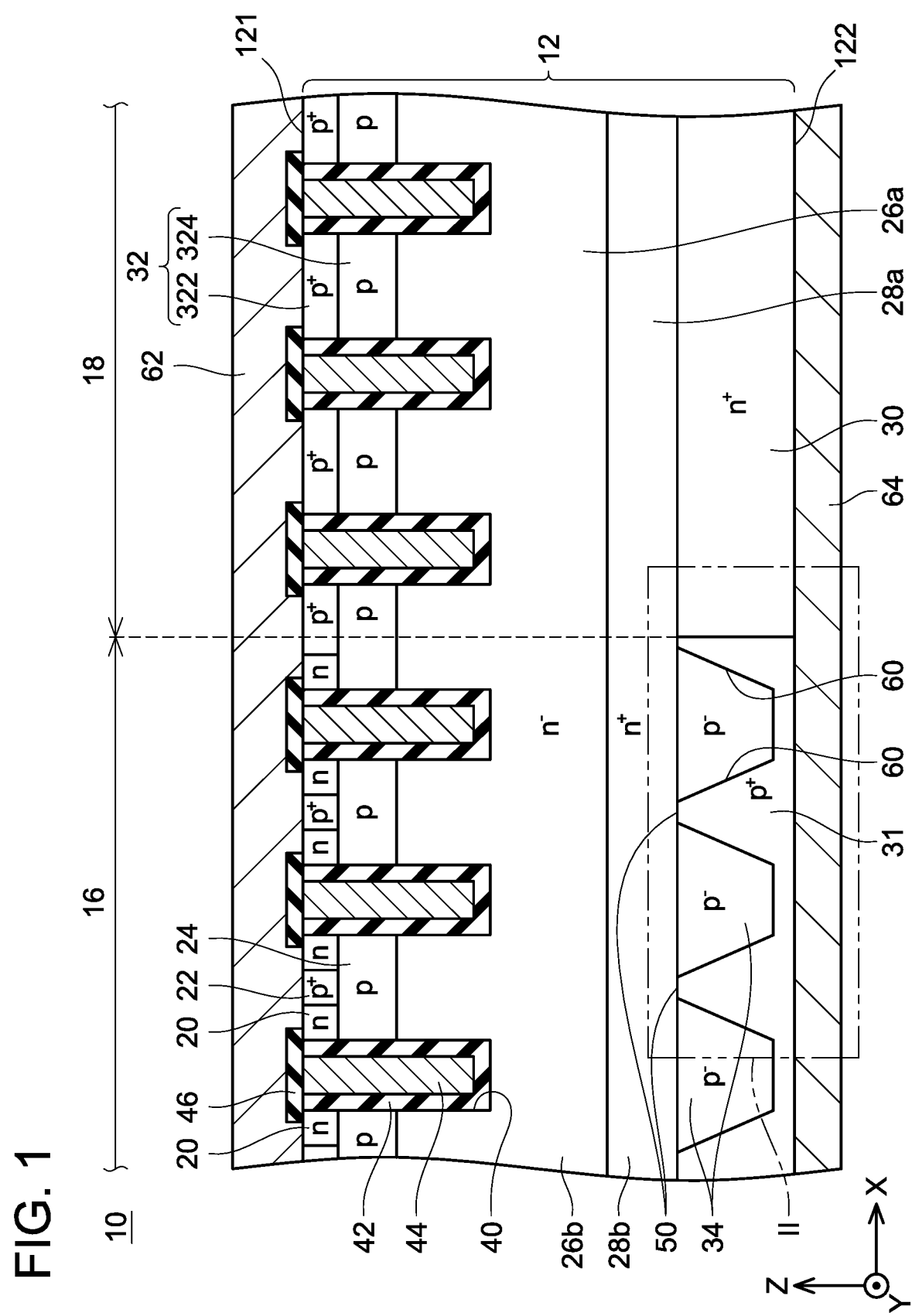
FIG. 1 is a cross-sectional view of a semiconductor device according to an embodiment.

With reference to the drawings, a semiconductor device 10 according to an embodiment will be described. As shown in FIG. 1, the semiconductor device 10 according to the embodiment comprises a semiconductor substrate 12, an upper surface electrode 62 disposed on an upper surface 121 of the semiconductor substrate 12, and a lower surface electrode 64 disposed on a lower surface 122 of the semiconductor substrate 12. Hereinbelow, a direction parallel to the semiconductor substrate 12 will be termed an X direction, a direction parallel to the semiconductor substrate 12 and orthogonal to the X direction will be termed a Y direction, and a direction perpendicular to the semiconductor substrate 12 will be termed a Z direction.

Each of the upper and lower surface electrodes 62, 64 is constituted of a metal such as, for example, titanium (Ti), aluminum silicon (AlSi), or aluminum (Al). The upper surface electrode 62 covers the upper surface 121 of the semiconductor substrate 12. The lower surface electrode 64 covers the lower surface 122 of the semiconductor substrate 12. The upper and lower surface electrodes 62, 64 are provided across a diode region 18 and an IGBT region 16 of the semiconductor substrate 12, both of which will be described below.

The semiconductor substrate 12 includes the diode region 18 and the IGBT region 16. The diode region 18 and the IGBT region 16 are arranged in the X direction. The IGBT region 16 and the diode region 18 are provided adjacent to each other. The semiconductor substrate 12 comprises a semiconductor element therein. The diode region 18 of the semiconductor substrate 12 includes a free wheeling diode (FWD) therein. The IGBT region 16 of the semiconductor substrate 12 includes an insulated gate bipolar transistor (IGBT) therein. Both of the IGBT and the FWD are provided in the same semiconductor substrate 12. The IGBT and the FWD are provided in reverse parallel. A reverse conducting insulated gate bipolar transistor (RC-IGBT) is thereby provided.

The diode region 18 of the semiconductor substrate 12 includes an anode region 32, a diode drift region 26a, a diode buffer region 28a, and a cathode region 30 in this order from an upper surface 121 side to a lower surface 122 side of the semiconductor substrate 12. The IGBT region 16 of the semiconductor substrate 12 includes emitter regions 20, body contact regions 22, a body region 24, an IGBT drift region 26b, an IGBT buffer region 286b, a plurality of low concentration regions 34, and a collector region 31 in this order from the upper surface 121 side to the lower surface 122 side of the semiconductor substrate 12. Moreover, a plurality of gate trenches 40 is provided in the diode region 18 and the IGBT region 16 of the semiconductor substrate 12.

(Diode Region 18)

The anode region 32 is provided in a portion that is in contact with the gate trenches 40. The anode region 32 is a region of a p-type (an example of a first conductive type). The anode region 32 includes an upper region 322 and a lower region 324. The upper region 322 is provided in a portion disposed at the upper surface 121 of the semiconductor substrate 12. The upper region 322 is in ohmic contact with the upper surface electrode 62. The lower region 324 is provided below the upper region 322. The lower region 324 is provided between the upper region 322 and the diode drift region 26a. The lower region 324 has an impurity concentration lower than an impurity concentration of the upper region 322.

The diode drift region 26a is provided below the anode region 32. The diode drift region 26a is provided between the anode region 32 and the cathode region 30. The diode drift region 26a is provided in a portion that is in contact with the gate trenches 40. The diode drift region 26a is a region of an n-type (an example of a second conductive type).

The diode buffer region 28a is provided below the diode drift region 26a. The diode buffer region 28a is provided between the diode drift region 26a and the cathode region 30. The diode buffer region 28a is an n-type region. The diode buffer region 28a has an impurity concentration higher than an impurity concentration of the diode drift region 26a.

The cathode region 30 is provided below the diode buffer region 28a. The cathode region 30 is provided in a portion disposed at the lower surface 122 of the semiconductor substrate 12. The cathode region 30 is an n-type region. The cathode region 30 is in ohmic contact with the lower surface electrode 64.

(IGBT Region 16)

The emitter regions 20 are provided, in islands, in portions disposed at the upper surface 121 of the semiconductor substrate 12. The emitter regions 20 are provided in portions that are in contact with the gate trenches 40. The emitter regions 20 are n-type regions. The emitter regions 20 are in ohmic contact with the upper surface electrode 62.

As shown in FIG. 1, the body contact regions 22 are provided, in islands, in portions disposed at the upper surface 121 of the semiconductor substrate 12. Each of the body contact regions 22 is provided adjacent to its corresponding emitter region 20. The body contact regions 22 are p-type regions. The body contact regions 22 are in ohmic contact with the upper surface electrode 62.

As shown in FIG. 1, the body region 24 is provided below the emitter regions 20 and the body contact regions 22. The body region 24 is provided between the emitter regions 20 and the body contact regions 22, and the IGBT drift region 26b. The body region 24 is provided in portions that is in contact with the gate trenches 40. The body region 24 is a p-type region. The body region 24 has an impurity concentration lower than an impurity concentration of the body contact regions 22.

The IGBT drift region 26b is provided below the body region 24. The IGBT drift region 26b is provided between the body region 24 and the IGBT buffer region 28b. The IGBT drift region 26b is provided between the emitter regions 20 and the collector region 31 via the body region 24 and the IGBT buffer region 28b. The IGBT drift region 26b is provided in portions that is in contact with the gate trenches 40. The IGBT drift region 26b is provided adjacent to the diode drift region 26a. The IGBT drift region 26b is integrated with the diode drift region 26a. The IGBT drift region 26b is an n-type region. The IGBT drift region 26b has an impurity concentration lower than an impurity concentration of the emitter regions 20.

The IGBT buffer region 28b is provided below the IGBT drift region 26b. The IGBT buffer region 28b is provided between the IGBT drift region 26b and the collector region 31. The IGBT buffer region 28b is provided adjacent to the diode buffer region 28a. The IGBT buffer region 28b is integrated with the diode buffer region 28a. The IGBT buffer region 28b is an n-type region. The IGBT buffer region 286b has an impurity concentration higher than the impurity concentration of the IGBT drift region 26b.

Figure 2:
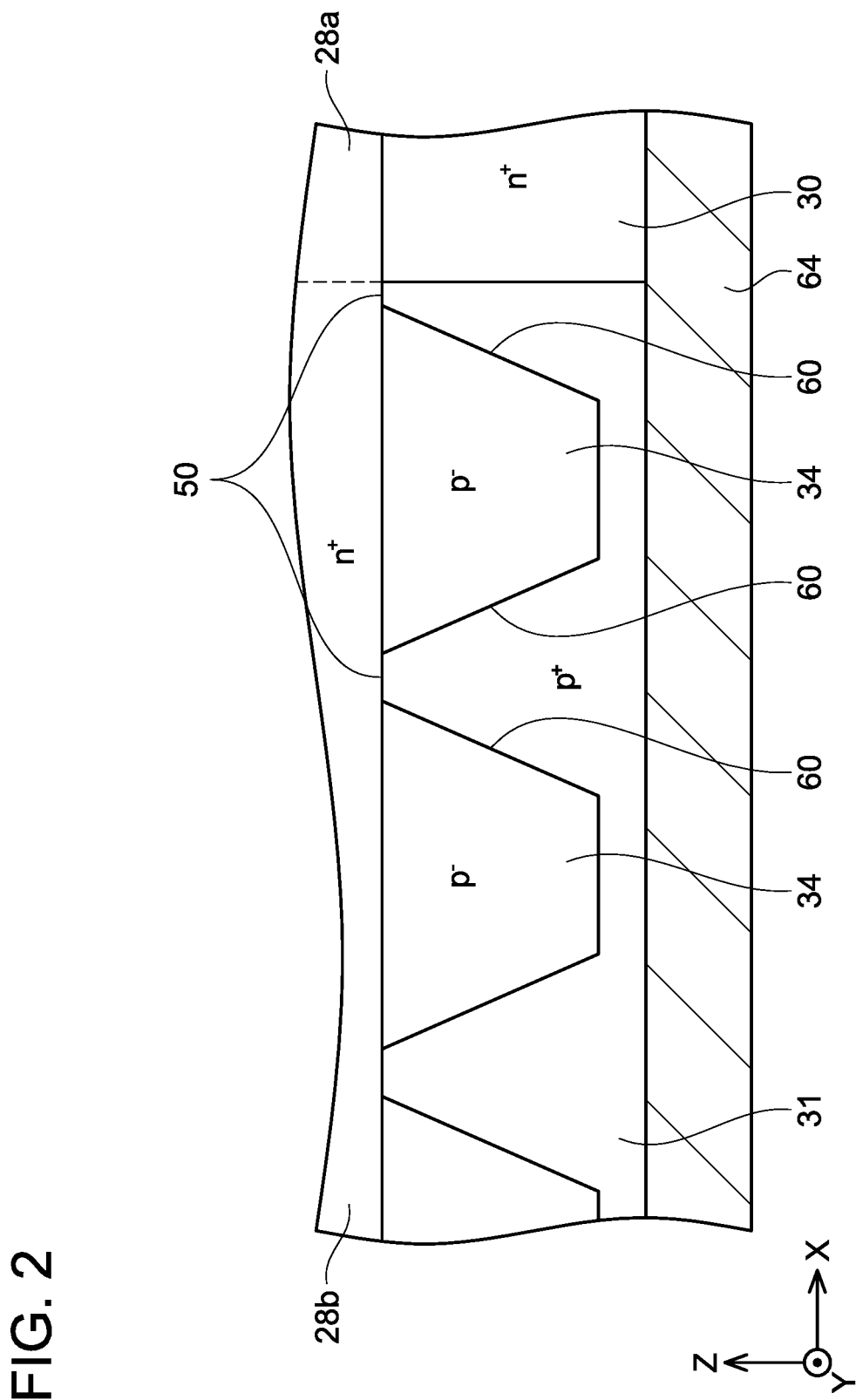
FIG. 2 is an enlarged view of a main part II in FIG. 1.

The plurality of low concentration regions 34 is provided below the IGBT buffer region 28b. The plurality of low concentration regions 34 is provided between the IGBT buffer region 28b and the collector region 31. The plurality of low concentration regions 34 is arranged with intervals therebetween in a direction parallel to the semiconductor substrate 12. The plurality of low concentration regions 34 is arranged with intervals therebetween in a direction (the X direction) along which the diode region 18 and the IGBT region 16 are adjacent to each other. Each of the low concentration regions 34 is a p-type region. Each of the low concentration regions 34 has an impurity concentration lower than an impurity concentration of the collector region 31. As shown in FIG. 2, each of the low concentration regions 34 includes a lateral direction contact portion 60. Each lateral direction contact portion 60 is in contact with the collector region 31 in the direction (the X direction) along which the diode region 18 and the IGBT region 16 are adjacent to each other. Distance between the low concentration regions 34 adjacent to each other in the X direction is larger on a collector region 31's side than on an IGBT buffer region 28b's side. The lateral direct contact portions 60 of the low concentration regions 34 are tilted relative to the upper surface 121 of the semiconductor substrate 12.

The collector region 31 is provided below the IGBT buffer region 28b and the plurality of low concentration regions 34. The collector region 31 is provided in a portion disposed at the lower surface 122 of the semiconductor substrate 12. The collector region 31 is in contact with the cathode region 30 in the direction (the X direction) along which the diode region 18 and the IGBT region 16 are adjacent to each other. The collector region 31 is a p-type region. The collector region 31 is in ohmic contact with the lower surface electrode 64. The collector region 31 includes a plurality of vertical direction (the Z direction) contact portions 50 (an example of a first contact portion). Each of the vertical direction contact portions 50 is in contact with the IGBT buffer region 28b between the low concentration regions 34 adjacent to each other. Each of the vertical direction contact portions 50 is provided in a portion disposed at an upper surface of the collector region 31.

In a cross section of the semiconductor substrate 12 along the direction perpendicular to the semiconductor substrate 12 and along the direction in which the plurality of low concentration regions 34 are arranged, an area of the collector region 31 is smaller than a sum of areas of the plurality of low concentration regions 34 (the sum of the areas of the plurality of low concentration regions 34 is larger than the area of the collector region 31). The area of each of the low concentration regions 34 is smaller than the area of the collector region 31.

As shown in FIG. 1, each of the gate trenches 40 in the IGBT region 16 extends from the upper surface 121 of the semiconductor substrate 12 to a depth reaching the IGBT drift region 26b through its corresponding emitter region 20 and the body region 24. Each of the gate trenches 40 in the diode region 18 extends from the upper surface 121 of the semiconductor substrate 12 to a depth reaching the diode drift region 26a through the anode region 32. A gate insulating film 42 and a gate electrode 44 are disposed in each of the gate trenches 40. Each gate insulating film 42 covers an inner surface of its corresponding gate trench 40. Each gate insulating film 42 insulates the semiconductor substrate 12 and its corresponding gate electrode 44 from each other. Each gate electrode 44 is disposed on inner side relative to its corresponding gate insulating film 42. An interlayer insulating film 46 is disposed on the gate electrodes 44. The interlayer insulating film 46 insulates the gate electrodes 44 and the upper surface electrode 62 from each other.

Next, an operation of the semiconductor device 10 will be described. Firstly, an operation of the semiconductor device 10 when the IGBT is in an on-state (a state where a current flows in the IGBT region 16) will be described. When the IGBT is in the on-state, a higher potential is applied to the lower surface electrode 64 of the semiconductor device 10 than to the upper surface electrode 62 of the semiconductor device 10. Moreover, a potential equal to or higher than a threshold is applied to the gate electrodes 44, and channels are formed in the body region 24 of the IGBT region 16. Due to this, electrons flow from the upper surface electrode 62 to the lower surface electrode 64 through the emitter regions 20, the channels in the body region 24, the IGBT drift region 26b, the IGBT buffer region 28b, and the collector region 31. Moreover, a part of the electrons flows from the IGBT buffer region 28b to the lower surface electrode 64 through the plurality of low concentration regions 34 and the collector region 31. Moreover, concurrently with the flow of the electrons, holes flow from the lower surface electrode 64 to the upper surface electrode 62 through the collector region 31, the IGBT buffer region 28b, the IGBT drift region 26b, the body region 24, and the body contact regions 22.

Moreover, a part of the holes flows from the collector region 31 to the IGBT buffer region 28b through the plurality of low concentration regions 34. At this time, the part of the holes that flow in each of the low concentration regions 34 is accumulated in the low concentration regions 34.

Next, an operation of the semiconductor device 10 when the IGBT is turned off will be described. In this case, the potential applied to the gate electrodes 44 is made to be lower than the threshold. Due to this, the channels, which have been formed in the body region 24 of the IGBT region 16, disappear. Moreover, a higher potential is applied to the upper surface electrode 62 of the semiconductor device 10 than to the lower surface electrode 64 of the semiconductor device 10. The IGBT is thereby turned off (the current stops flowing in the IGBT region 16). Upon turn-off of the IGBT, the holes, which have been accumulated in the IGBT region 16 of the semiconductor substrate 12, are discharged to the lower surface electrode 64 through the collector region 31. At this time, the holes, which have been accumulated in the plurality of low concentration regions 34, move to the collector region 31, thereby leading to a gentle decrease in current that flows in the IGBT region 16. A sharp current decrease at turn-off of the IGBT is therefore mitigated.

Moreover, concurrently with the turn-off of the IGBT, the diode is turned on (a current flows in the diode region 18). Upon turn-on of the diode, electrons flow from the lower surface electrode 64 to the upper surface electrode 62 through the cathode region 30, the diode buffer region 28a, the diode drift region 26a, and the anode region 32. Moreover, concurrently with the flow of the electrons, holes flow from the upper surface electrode 62 to the lower surface electrode 64 through the anode region 32, the diode drift region 26a, the diode buffer region 28a, and the cathode region 30.

Next, an operation of the semiconductor device 10 when the IGBT is turned on will be described. In this case, a higher potential is applied to the lower surface electrode 64 of the semiconductor device 10 than to the upper surface electrode 62 of the semiconductor device 10. Moreover, a potential equal to or higher than the threshold is applied to the gate electrodes 44, and channels are formed in the body region 24 of the IGBT region 16. The IGBT is thereby turned on (a current flows in the IGBT region 16). Upon turn-on of the IGBT, electrons flow from the upper surface electrode 62 to the lower surface electrode 64 through the emitter regions 20, the channels in the body region 24, the IGBT drift region 26b, the IGBT buffer region 28b, and the collector region 31. Moreover, concurrently with the flow of the electrons, holes flow from the lower surface electrode 64 to the upper surface electrode 62 through the collector region 31, the IGBT buffer region 28b, the IGBT drift region 26b, the body region 24, and the body contact regions 22. At this time, since the collector region 31 includes the vertical direction contact portions 50 that are in contact with the IGBT buffer region 28b, carriers (the electrons and the holes) move through the contact portions 50. Therefore, when the IGBT is turned on, the carriers are not hindered from moving between the collector region 31 and the IGBT buffer region 28b. This can suppress a phenomenon in which a voltage between the emitter regions 20 and the collector region 31 temporarily rises at turn-on of the IGBT and then the current that flows in the IGBT increases. In other words, the snap-back phenomenon can be suppressed.

Moreover, after turn-on of the IGBT, a part of the electrons flow from the IGBT buffer region 28b to the collector region 31 through the plurality of low concentration regions 34. Moreover, a part of the holes flow from the collector region 31 to the IGBT buffer region 28b through the plurality of low concentration regions 34. At this time, the part of the holes flowing in each of the low concentration regions 34 is accumulated in the low concentration region 34.

The semiconductor device 10 according to the embodiment has been described above. As is clear from the description above, the semiconductor device 10 includes the plurality of low concentration regions 34 provided between the IGBT buffer region 28b and the collector region 31. Each of the low concentration regions 34 has the impurity concentration lower than the impurity concentration of the collector region 31. The plurality of low concentration regions 34 are arranged with intervals therebetween in the direction (the X direction) parallel to the semiconductor substrate 12. Moreover, the collector region 31 includes the vertical direction contact portions 50 each of which is in contact with the IGBT buffer region 28b between the low concentration regions 34 adjacent to each other. According to this configuration, holes are accumulated in the plurality of low concentration regions 34 when the IGBT is in an the on state, thereby a sharp current decrease at turn-off of the IGBT is mitigated. This suppresses an oscillation (a noise) of a voltage between the upper and lower surface electrodes, at turn-off of the IGBT. Moreover, at turn-on of the IGBT, carriers (electrons and holes) flow in a vertical direction through the vertical direction contact portions 50 of the collector region 31. The carriers are therefore not hindered from moving between the IGBT buffer region 28b and the collector region 31, and the snap-back phenomenon is suppressed. The semiconductor device 10 above thus can suppress the snap-back phenomenon at turn-on of the IGBT, while suppressing the noise at turn-off of the IGBT.

Moreover, in the semiconductor device 10 above, the collector region 31, which has the higher impurity concentration than the low concentration regions 34, is in contact with the cathode region 30 in the direction (the X direction) along which the diode region 18 and the IGBT region 16 are adjacent to each other. This can make a boundary of the cathode region 30 clear, and can make a boundary between the diode region 18 and the IGBT region 16 clear. Moreover, in the semiconductor device 10 above, the sum of the areas of the plurality of low concentration regions 34 is larger than the area of the collector region 31. This can increase the amount of carriers to be accumulated in the plurality of low concentration regions 34. The sharp current decrease at turn-off of the IGBT is thereby mitigated, so the noise can be suppressed.

The embodiment has been described above. However, specific aspects are not limited to the embodiment above. In the following description, configurations similar to the configurations in the description above will be denoted with the identical signs, and description thereof will be omitted.

In the embodiment above, the plurality of low concentration regions 34 are arranged in the X direction. However, no limitation is placed thereto. In another embodiment, the plurality of low concentration regions 34 may be arranged in the Y direction. In other words, the plurality of low concentration regions 34 may be arranged in the direction orthogonal to the direction along which the diode region 18 and the IGBT region 16 are arranged.

Moreover, the embodiment above is configured such that in the cross section of the semiconductor substrate 12 along the direction perpendicular to the semiconductor substrate 12 and along the direction in which the plurality of low concentration regions 34 are arranged, the sum of the areas of the plurality of low concentration regions 34 is larger than the area of the collector region 31. However, no limitation is placed thereto. In another embodiment, the sum of the areas of the plurality of low concentration regions 34 may be smaller than the area of the collector region 31.

(First Variant)

Figure 3:
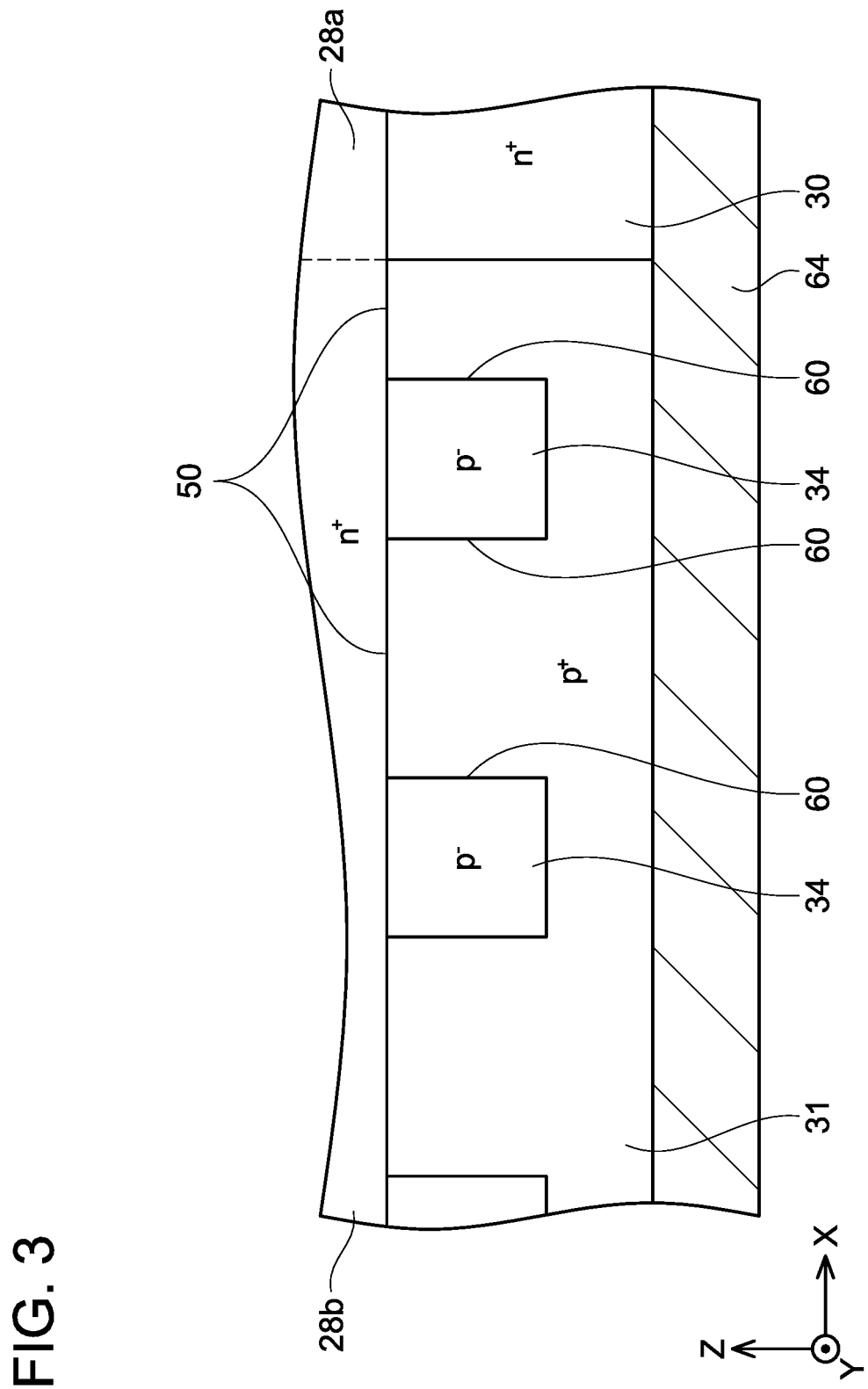
FIG. 3 is a diagram of a semiconductor device 10 according to a first variant, which corresponds to FIG. 2.

Variants will be described. As shown in FIG. 3, in the semiconductor device 10 according to a first variant, each of the lateral direction contact portions 60 (an example of a second contact portion) of the low concentration regions 34 extends parallel to a direction (the Z direction) perpendicular to the semiconductor substrate 12. In a cross section shown in FIG. 3, each of the low concentration regions 34 has a rectangular shape.

(Second Variant)

Figure 4:
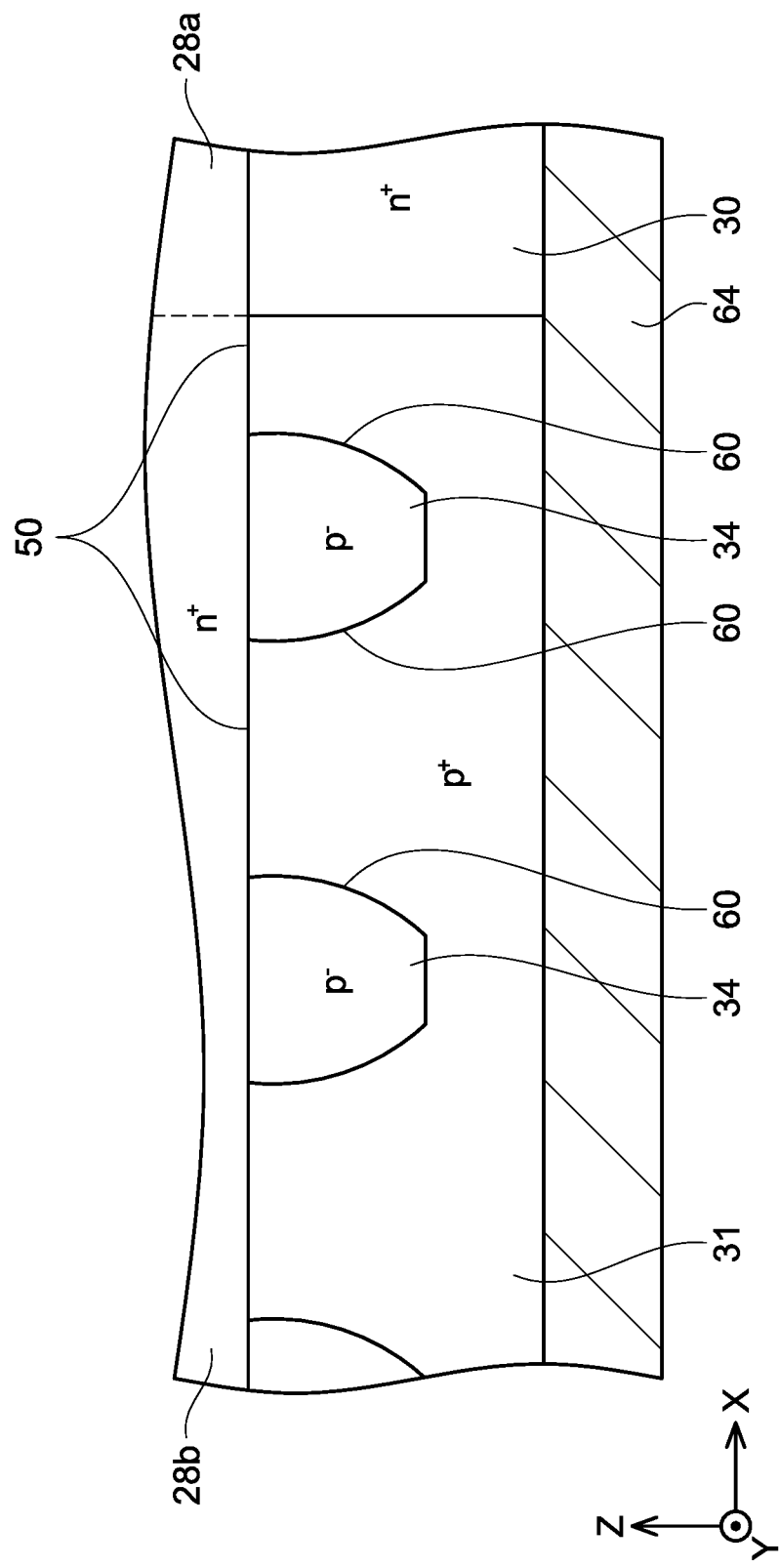
FIG. 4 is a diagram of the semiconductor device 10 according to a second variant, which corresponds to FIG. 2.

As shown in FIG. 4, in the semiconductor device 10 according to a second variant, each of the lateral direction contact portions 60 of the low concentration regions 34 is curved. Each of the lateral direction contact portions 60 of the low concentration regions 34 is curved convexly toward a collector region 31 side.

(Third Variant)

Figure 5:
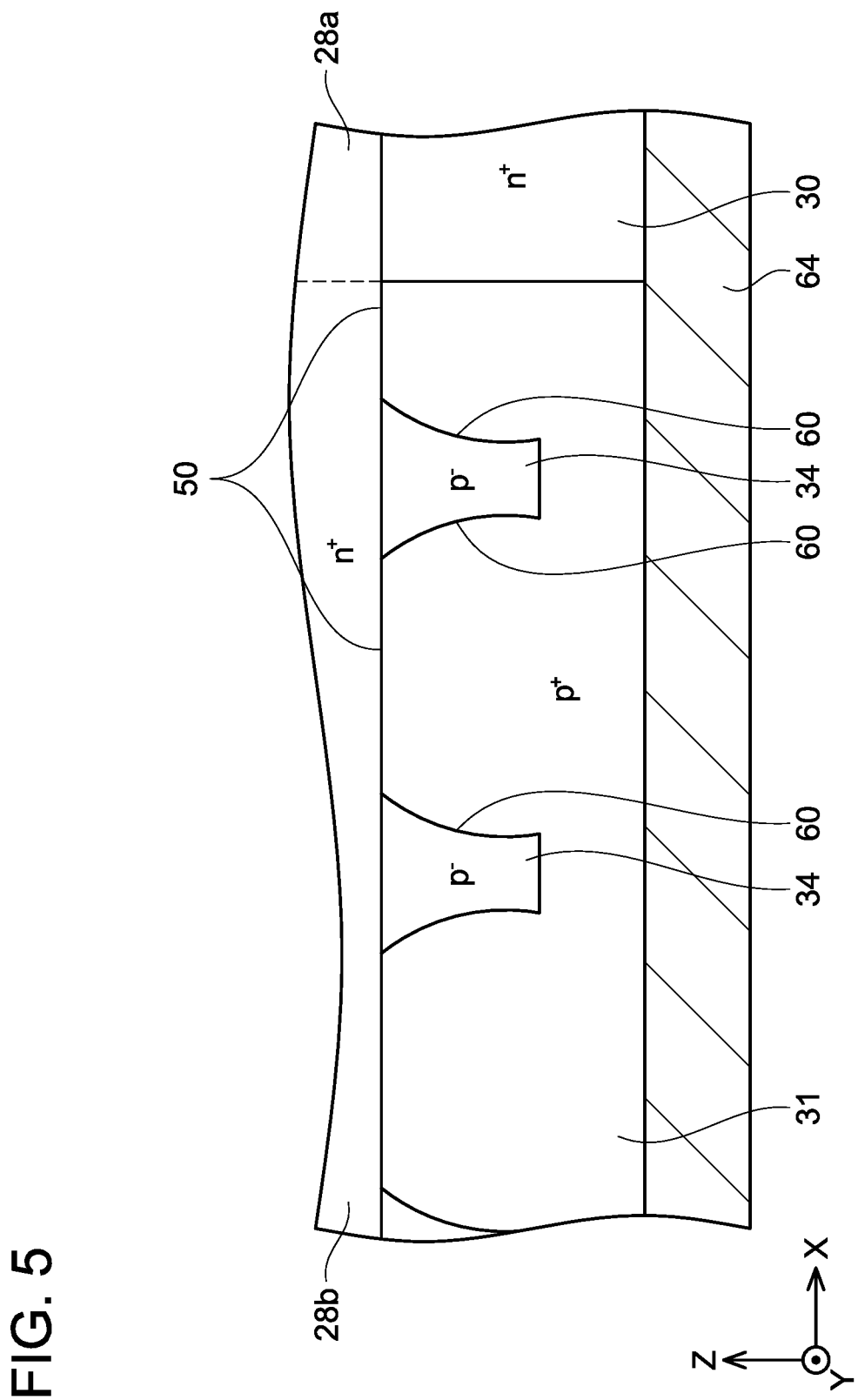
FIG. 5 is a diagram of the semiconductor device 10 according to a third variant, which corresponds to FIG. 2.

As shown in FIG. 5, in the semiconductor device 10 according to a third variant, each of the lateral direction contact portions 60 of the low concentration regions 34 is curved convexly toward a low concentration region 34 side.

(Fourth Variant)

Figure 6:
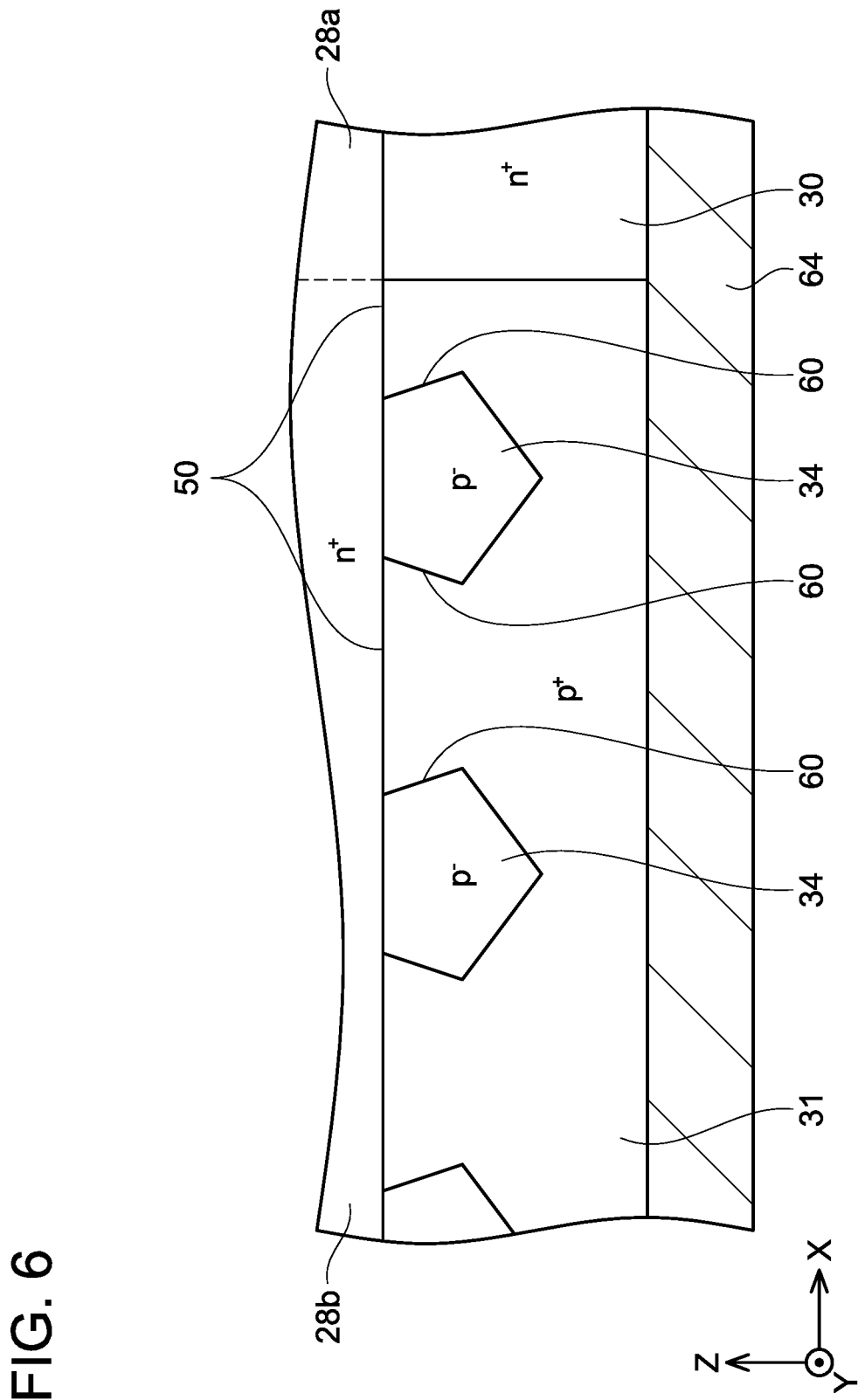
FIG. 6 is a diagram of the semiconductor device 10 according to a fourth variant, which corresponds to FIG. 2.

As shown in FIG. 6, in the semiconductor device 10 according to a fourth variant, each of the lateral direction contact portions 60 of the low concentration regions 34 is angularly bent convexly toward the collector region 31 side.

(Fifth Variant)

Figure 7:
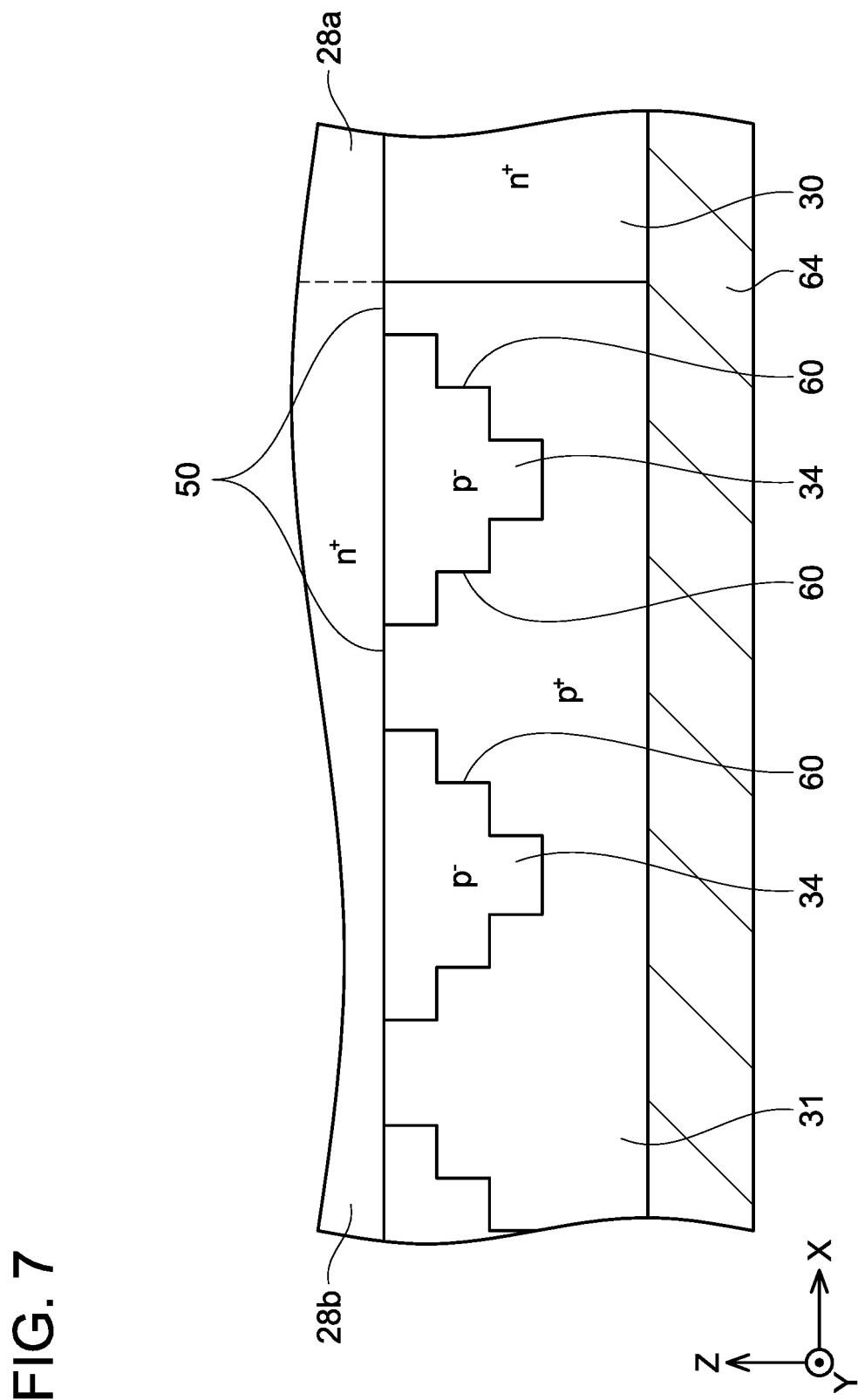
FIG. 7 is a diagram of the semiconductor device 10 according to a fifth variant, which corresponds to FIG. 2.

As shown in FIG. 7, in the semiconductor device 10 according to a fifth variant, each of the lateral direction contact portions 60 of the low concentration regions 34 has a stairs shape.

Some of the technical elements disclosed herein will be listed. It should be noted that the respective technical elements are independent of one another, and are useful solely or in combinations.

In a semiconductor device disclosed herein, the collector region may be in contact with the cathode region in a direction along which the diode region and the IGBT region are adjacent to each other.

According to this configuration, since the first conductive-type collector region having a high impurity concentration is provided adjacent to the second conductive-type cathode region, a boundary of the cathode region can be made to be clear. Thereby, a boundary between the diode region and the IGBT region can be made to be clear.

In the semiconductor device disclosed herein, in a cross section of the semiconductor substrate along a direction perpendicular to the semiconductor substrate and along a direction in which the plurality of low concentration regions is arranged, a sum of areas of the plurality of low concentration regions may be larger than an area of the collector region.

According to this configuration, the amount of carriers to be accumulated in the low concentration regions when the IGBT is in an on-state can be increased. A noise at turn-off of the IGBT can therefore be suppressed.

In the semiconductor device disclosed herein, each of the low concentration regions may comprise a second contact portion that is in contact with the collector region in a direction along which the diode region and the IGBT region are adjacent to each other. Each of the second contact portions of the low concentration regions may extend parallel to a direction perpendicular to the semiconductor substrate.

According to this configuration, the low concentration regions and the collector region can be formed in the semiconductor substrate with a simple process.

What is claimed is:

1. A semiconductor device comprising:
   a semiconductor substrate;
   an upper surface electrode disposed on an upper surface of the semiconductor substrate; and
   a lower surface electrode disposed on a lower surface of the semiconductor substrate,
   wherein
   the semiconductor substrate comprises:
      a diode region; and
      an IGBT region provided adjacent to the diode region,
   the diode region comprises:
      a first conductive-type anode region provided in a portion disposed at the upper surface of the semiconductor substrate;
      a second conductive-type cathode region provided in a portion disposed at the lower surface of the semiconductor substrate; and
      a second conductive-type diode drift region provided between the anode region and the cathode region,
   the IGBT region comprises:
      a second conductive-type emitter region provided in a portion disposed at the upper surface of the semiconductor substrate;
      a first conductive-type collector region provided in a portion disposed at the lower surface of the semiconductor substrate;
      a second conductive-type IGBT drift region provided between the emitter region and the collector region, and provided adjacent to the diode drift region;
      a first conductive-type body region provided between the emitter region and the IGBT drift region;
      a gate trench extending from the upper surface of the semiconductor substrate to a depth reaching the IGBT drift region through the emitter region and the body region;
      a second conductive-type buffer region provided between the IGBT drift region and the collector region and having a higher impurity concentration than the IGBT drift region; and
      a plurality of first conductive-type low concentration regions provided between the buffer region and the collector region, arranged with intervals therebetween in a direction parallel to the semiconductor substrate, and having a lower impurity concentration than the collector region,
   a gate electrode is disposed in the gate trench, and
   the collector region comprises a first contact portion that is in contact with the buffer region between the low concentration regions adjacent to each other.

2. The semiconductor device according to claim 1, wherein
   the collector region is in contact with the cathode region in a direction along which the diode region and the IGBT region are adjacent to each other.

3. The semiconductor device according to claim 1, wherein
   in a cross section of the semiconductor substrate along a direction perpendicular to the semiconductor substrate and along a direction in which the plurality of low concentration regions is arranged, a sum of areas of the plurality of low concentration regions is larger than an area of the collector region.

4. The semiconductor device according to claim 1, wherein
   each of the low concentration regions comprises a second contact portion that is in contact with the collector region in a direction along which the diode region and the IGBT region are adjacent to each other, and
   each of the second contact portions of the low concentration regions extends parallel to a direction perpendicular to the semiconductor substrate.

* * * * *